US008624597B2

(12) United States Patent
Banerjee et al.

(10) Patent No.: US 8,624,597 B2
(45) Date of Patent: Jan. 7, 2014

(54) RF COIL ARRAY FOR CARDIAC AND THORACIC MAGNETIC RESONANCE IMAGING

(75) Inventors: Modhurin Banerjee, Streetsboro, OH (US); Fraser Robb, Aurora, OH (US); Pei H. Chan, Aurora, OH (US)

(73) Assignee: General Electric Company, Schenectady, NY (US)

( * ) Notice: Subject to any disclaimer, the term of this patent is extended or adjusted under 35 U.S.C. 154(b) by 363 days.

(21) Appl. No.: 12/978,839

(22) Filed: Dec. 27, 2010

(65) Prior Publication Data

US 2012/0161769 A1   Jun. 28, 2012

(51) Int. Cl.
*G01R 33/44* (2006.01)
(52) U.S. Cl.
USPC .......................................... 324/318
(58) Field of Classification Search
USPC .......................................... 324/318
See application file for complete search history.

(56) References Cited

U.S. PATENT DOCUMENTS

| | | | |
|---|---|---|---|
| 6,650,926 B1 | 11/2003 | Chan et al. | |
| 6,784,665 B1 * | 8/2004 | Chan et al. | 324/318 |
| 6,930,481 B2 * | 8/2005 | Okamoto et al. | 324/318 |
| 6,975,115 B1 | 12/2005 | Fujita et al. | |
| 7,049,819 B2 | 5/2006 | Chan et al. | |
| 2010/0265020 A1 | 10/2010 | Chan et al. | |

OTHER PUBLICATIONS

Chan et al., Double Loop-Asymmetric Saddle Coil Arrays Optimized for Spine and Torso Imaging, 2008, ISMRM, 16, p. 2976.*
Xu, et al., Feasibility of Five-Minute Comprehensive Cardiac MR Examination Using Highly Accelerated Parallel Imaging with a 32-Element Coil Array, Proc. Intl. Soc. Mag. Reson. Med. 17 (2009), p. 765.
Schmitt, et al., A 128 Channel Receive-Only Cardiac Coil for 3T, Proc. Intl. Soc. Mag. Reson. Med. 15 (2007), p. 245.
Griswold, et al., Field-of-View Limitations in Parallel Imaging, Magnetic Resonance in Medicine 52:1118-1126 (2004).
Reeder, et al., Practical Approaches to the Evaluation of Signal-to-Noise Ratio Performance with Parallel Imaging: Application with Cardiac Imaging and a 32-Channel Cardiac Coil, Magnetic Resonance in Medicine 54: 748-754 (2005).
P.H. Chan, Self-Developed Asymmetric Saddle Coil Array for SENSE Imaging, Proc. Intl. Soc. Mag. Reson. Med. 14 (2006), p. 3529.

* cited by examiner

*Primary Examiner* — Melissa Koval
*Assistant Examiner* — Rishi Patel
(74) *Attorney, Agent, or Firm* — The Small Patent Law Group; Dean D. Small (57) ABSTRACT

A radio frequency (RF) coil array includes a first coil section and a second coil section mechanically coupled to the first coil section. The first coil section includes a first row of a plurality of double asymmetric saddle coil pairs arranged in a left-right direction and a second row of a plurality of double asymmetric saddle coil pairs arranged in a left-right direction. The first row and the second row are arranged along a superior-inferior direction. The second coil section includes a plurality of loop coils arranged around at least a portion of a perimeter of the first coil section.

23 Claims, 8 Drawing Sheets

RF COIL ARRAY FOR CARDIAC AND THORACIC MAGNETIC RESONANCE IMAGING

FIELD OF THE INVENTION

The present invention relates generally to a magnetic resonance imaging (MRI) system and in particular to a two-part modular radio frequency (RF) coil array for cardiac and thoracic magnetic resonance imaging.

BACKGROUND OF THE INVENTION

Magnetic resonance imaging (MRI) is a medical imaging modality that can create pictures of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis," by convention). An MRI system also comprises components called gradient coils that produce smaller amplitude, spatially varying magnetic fields when a current is applied to them. Typically, gradient coils are designed to produce a magnetic field component that is aligned along the z axis, and that varies linearly in amplitude with position along one of the x, y or z axes. The effect of a gradient coil is to create a small ramp on the magnetic field strength, and concomitantly on the resonant frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. The RF coils are used to add energy to the nuclear spin system in a controlled fashion. As the nuclear spins then relax back to their rest energy state, they give up energy in the form of an RF signal. This signal is detected by the MRI system and is transformed into an image using a computer and known reconstruction algorithms.

As mentioned, RF coils are used in an MRI system to transmit RF excitation signals and to receive MR signals emitted by an imaging subject. Various types of RF coils may be utilized in an MRI system such as a whole-body coil and RF surface (or local) coils. Typically, the whole-body RF coil is used for transmitting RF excitation signals, although a whole-body RF coil may also be configured to receive MRI signals. One or more (e.g., an array) surface coils can be used as receive coils to detect MRI signals or, in certain applications, to transmit RF excitation signals. Surface coils may be placed in close proximity to a region of interest in a subject and, for reception, typically yield a higher signal-to-noise ratio (SNR) than a whole-body RF coil.

An array of surface RF coils can be used for "parallel imaging," a technique developed to accelerate MR data acquisition. In parallel imaging, multiple receive RF coils acquire (or receive) data from a region or volume of interest. For example, to perform parallel imaging for the human spine and torso, a three-dimensional (3D) RF coil array is used. A 3D RF coil array typically consists of an anterior two-dimensional (2D) RF coil array and a posterior 2D RF coil array.

Cardiac imaging and thoracic (e.g., vascular, other regions/structures in the thoracic cavity than the heart) imaging typically require different field of view and other imaging parameter requirements to achieve the best imaging performance. For example, cardiac imaging typically requires a field of view of 30 cm by 30 cm to cover the heart and cardiovascular imaging typically requires a field of view of 48 cm by 48 cm. RF coil arrays have been developed for cardiac and cardiac/thoracic imaging, however, such RF coil arrays can be heavy and bulky and therefore difficult for a technician to use and uncomfortable for a patient. Lightweight cardiac-only designs have been developed but cannot typically be used for vascular imaging.

It would be desirable to provide an RF coil array for cardiac and thoracic imaging that is a modular design and that provides a high channel count and high SNR performance.

BRIEF DESCRIPTION OF THE INVENTION

In accordance with an embodiment, a radio frequency (RF) coil array includes a first coil section having a first row of a plurality of double asymmetric saddle coil pairs arranged in a left-right direction and a second row of a plurality of double asymmetric saddle coil pairs arranged in a left-right direction, where the first row and the second row are arranged along a superior-inferior direction. The RF coil array also includes a second coil section mechanically coupled to the first coil section and having a plurality of loop coils arranged around at least a portion of a perimeter of the first coil section.

In accordance with another embodiment, an RF coil array system includes an anterior RF coil array and a posterior RE coil array. The anterior RF coil array includes a first anterior coil section having a plurality of double asymmetric saddle coil pairs and a second anterior coil section mechanically coupled to the first anterior coil section and having a plurality of loop coils arranged around at least a portion of a perimeter of the first anterior coil section. The posterior RF coil array includes a first posterior coil section having a plurality of double asymmetric saddle coil pairs and a second posterior coil section mechanically coupled to the first posterior coil section and having a plurality of loop coils arranged around at least a portion of a perimeter of the first posterior coil section.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION

Figure 1:
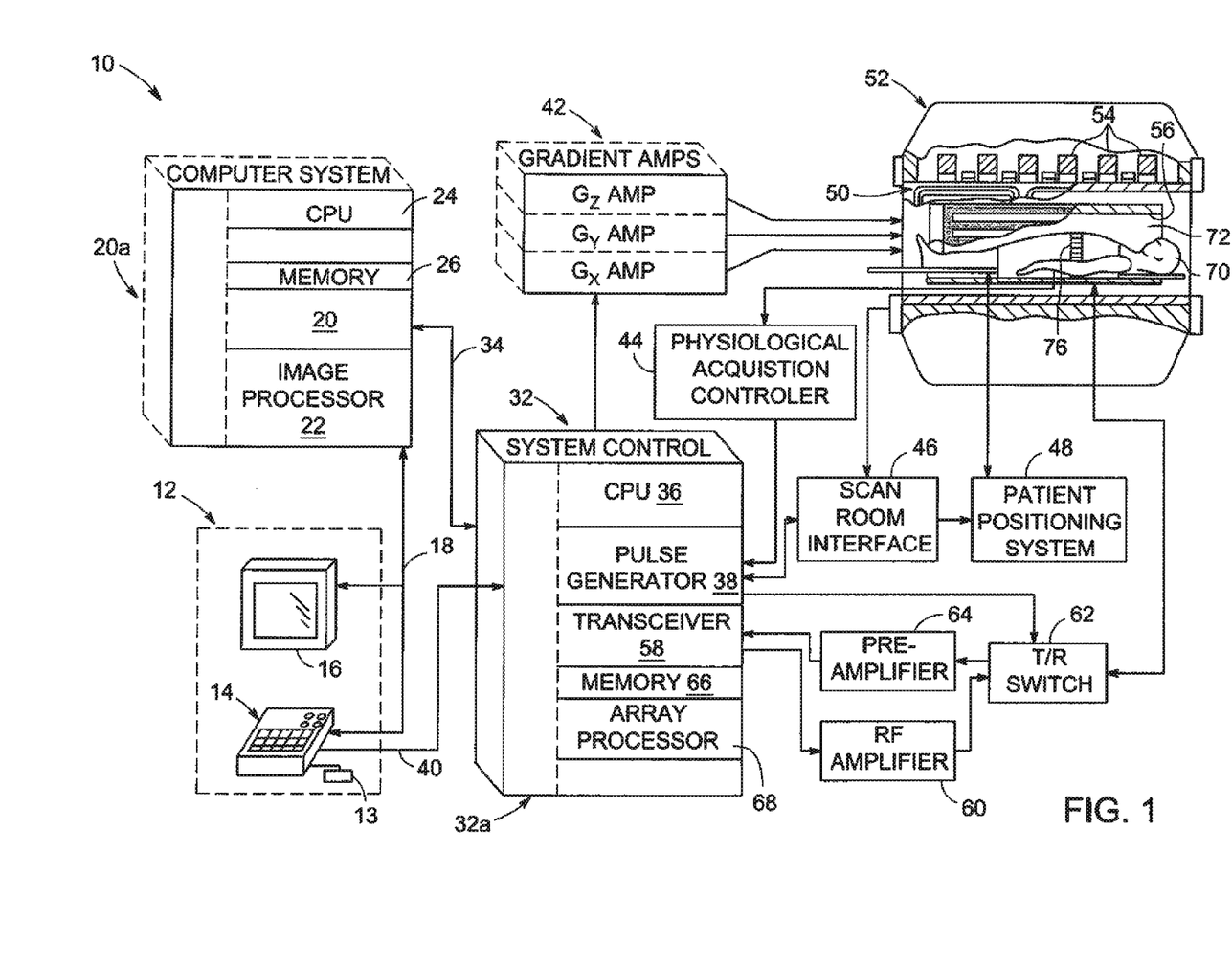
FIG. 1 is a schematic block diagram of an exemplary magnetic resonance imaging (MRI) system in accordance with an embodiment.

FIG. 1 is a schematic block diagram of an exemplary magnetic resonance imaging (MRI) system in accordance with an embodiment. The operation of MRI system 10 is controlled from an operator console 12 that includes a keyboard or other input device 13, a control panel 14, and a display 16. The console 12 communicates through a link 18 with a computer system 20 and provides an interface for an operator to prescribe MRI scans, display resultant images, perform image processing on the images, and archive data and images. The computer system 20 includes a number of modules that communicate with each other through electrical and/or data connections, for example, such as are provided by using a backplane 20a. Data connections may be direct wired links or may be fiber optic connections or wireless communication links or the like. The modules of the computer system 20 include an image processor module 22, a CPU module 24 and a memory module 26 which may include a frame buffer for storing image data arrays. In an alternative embodiment, the image processor module 22 may be replaced by image processing functionality on the CPU module 24. The computer system 20 is linked to archival media devices, permanent or back-up memory storage or a network. Computer system 20 may also communicate with a separate system control computer 32 through a link 34. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connections 32a. Data connections 32a may be direct wired links, or may be fiber optic connections or wireless communication links or the like. In alternative embodiments, the modules of computer system 20 and system control computer 32 may be implemented on the same computer system or a plurality of computer systems. The modules of system control computer 32 include a CPU module 36 and a pulse generator module 38 that connects to the operator console 12 through a communications link 40. The pulse generator module 38 may alternatively be integrated into the scanner equipment (e.g., resonance assembly 52). It is through link 40 that the system control computer 32 receives commands from the operator to indicate the scan sequence that is to be performed. The pulse generator module 38 operates the system components that play out (i.e., perform) the desired pulse sequence by sending instructions, commands and/or requests describing the timing, strength and shape of the RF pulses and pulse sequences to be produced and the timing and length of the data acquisition window. The pulse generator module 38 connects to a gradient amplifier system 42 and produces data called gradient waveforms that control the timing and shape of the gradient pulses that are to be used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 which is comprised of $G_x$, $G_y$ and $G_z$ amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of a resonance assembly 52 that includes a polarizing superconducting magnet with superconducting main coils 54. Resonance assembly 52 may include a whole-body RF coil 56, surface or parallel imaging coils 76 or both. The coils 56, 76 of the RF coil assembly may be configured for both transmitting and receiving or for transmit-only or receive-only. A patient or imaging subject 70 may be positioned within a cylindrical patient imaging volume 72 of the resonance assembly 52. A transceiver module 58 in the system control computer 32 produces pulses that are amplified by an RF amplifier 60 and coupled to the RF coils 56, 76 by a transmit/receive switch 62. The resulting signals emitted by the excited nuclei in the patient may be sensed by the same RF coil 56 and coupled through the transmit/receive switch 62 to a preamplifier 64. Alternatively, the signals emitted by the excited nuclei may be sensed by separate receive coils such as parallel coils or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the RF coil 56 during the receive mode. The transmit/receive switch 62 can also enable a separate RF coil (for example, a parallel or surface coil 76) to be used in either the transmit or receive mode.

The MR signals sensed by the RF coil 56 or parallel or surface coil 76 are digitized by the transceiver module 58 and transferred to a memory module 66 in the system control computer 32. Typically, frames of data corresponding to MR signals are stored temporarily in the memory module 66 until they are subsequently transformed to create images. An array processor 68 uses a known transformation method, most commonly a Fourier transform, to create images from the MR signals. These images are communicated through the link 34 to the computer system 20 where it is stored in memory. In response to commands received from the operator console 12, this image data may be archived in long-term storage or it may be further processed by the image processor 22 and conveyed to the operator console 12 and presented on display 16.

Figure 2:
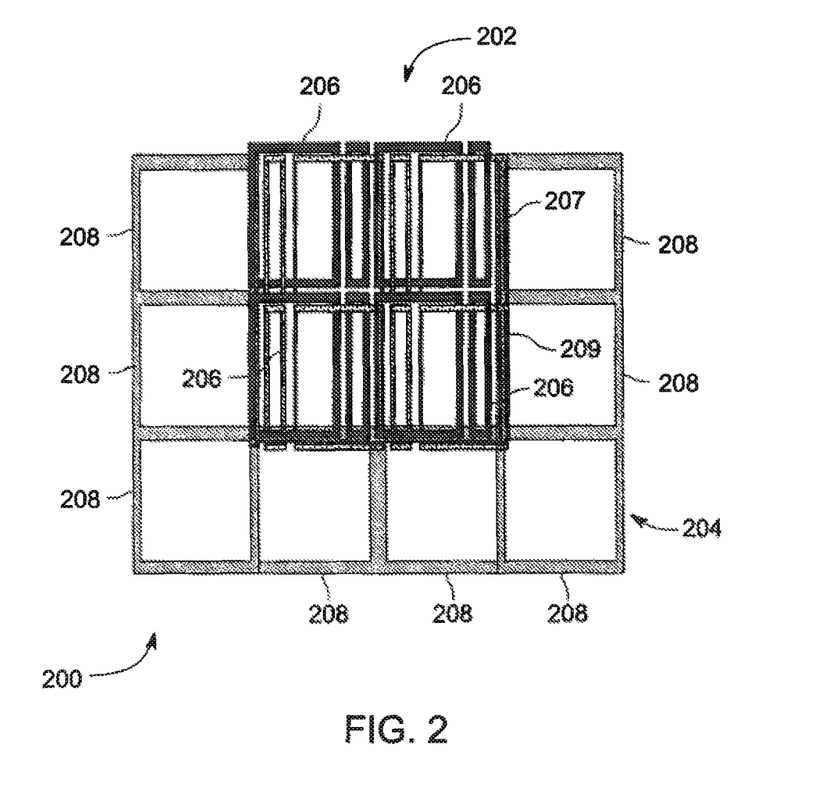
FIG. 2 shows an RF coil array in accordance with an embodiment.

As mentioned, RF coils (for example, RF body coil 56 and a surface coil or coils 76) may be used to transmit RF excitation pulses and/or to receive MR signals. An array of RF surface coils 76 may be used, for example, for parallel imaging applications to receive data from a region or volume of interest. FIG. 2 shows an RF coil array in accordance with an embodiment. RF coil array 200 consists of a first coil array section 202 and a second coil array section 204. As shown, RF coil array 200 has sixteen (16) channels. The first coil array section 202 provides eight (8) channels and the second coil array section 204 provides eight (8) channels. The elements (e.g., the coils) of RF coil array 200 are arranged (e.g., overlapped) so that the elements are magnetically decoupled. In a preferred embodiment, RF coil array 200 is a modular design where the second coil array section 204 may be detached from the first coil array section 202. In this embodiment, the second coil array section 204 is attached to the first coil array section 202 using mechanical and electrical connections as described further below with respect to FIGS. 6-10.

Figure 3:
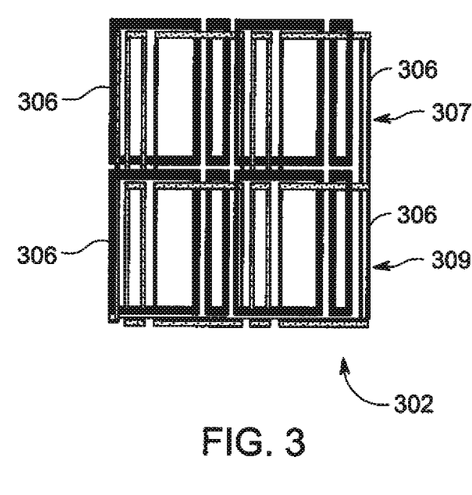
FIG. 3 shows a first coil section of the RF coil array of FIG. 2 in accordance with an embodiment.

The first coil array section 202 consists of four double asymmetric saddle (DAS) coil pairs 206 arranged in two rows 207, 209 in the superior-inferior direction. FIG. 3 shows a first coil section of the RF coil array 200 in accordance with an embodiment. Each row 307, 309 of the first coil array section 302 consists of two double asymmetric saddle coil pairs 306 arranged in the left-right direction. In alternative embodiments, more than two double asymmetric saddle coil pairs 306 may be used in each row 307, 309. The DAS coil pairs 306 are formed together on a former such as, for example, a rigid former or a foam former as known in the art. In a preferred embodiment, the first coil array section 202, 302 is configured for and dedicated to cardiac imaging. The DAS coil pairs 306 generate a high SNR and resolution at a relatively shallow depth of structures in the central thoracic region, such as the heart. The DAS coil pairs 306 allow the RF coil array to have high SNR for imaging within the cardiac region.

Figure 4:
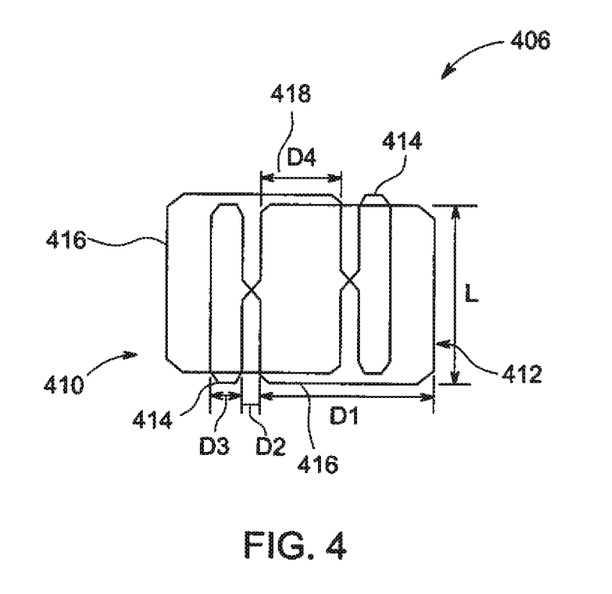
FIG. 4 shows a double asymmetric saddle coil pair in accordance with an embodiment.

Each DAS coil pair 206, 306 consists of two highly overlapped asymmetric saddle coils. FIG. 4 shows a double a double asymmetric saddle coil pair in accordance with an embodiment. In FIG. 4, a double asymmetric saddle (DAS) coil pair 406 includes a first asymmetric saddle coil 410 and a second asymmetric saddle coil 412. Each asymmetric saddle coil 410, 412 has a small wing 414 and a large wing 416. The width (D1) of the large wing 416 is larner than the width (D3) of the small wing 414 (e.g., D1/D3>1). Each wing 414, 416 in FIG. 4 is shown having an exemplary length, L, the shape of the two wings 414, 416 for each asymmetric saddle coil 410, 412 can be arbitrary. As the ratio of the size of the large wing 416 over that of the small wing 414 becomes much larger than unity, the MRI efficiency of the asymmetric saddle coil will approach to that of a loop coil of similar size and therefore the performance will be better than that of a conventional saddle coil. Accordingly, each of the asymmetric saddle coils 410, 412 behaves very much like a loop coil and has similar efficiency for MRI as a loop coil. The direction of the magnetic flux produced in one wing of an asymmetric saddle coil is opposite to that produced in the other wing, for example, if the magnetic flux in the first wing of an asymmetric saddle coil is pointing out of the surface of the first wing, then the magnetic flux in the second wing will be pointing into the surface of the second wing.

The first asymmetric saddle coil 410 and the second asymmetric saddle coil 412 are overlapped to form the DAS coil pair 406. The overlap, for example, the overlap region D4 (418) of the large wing of the first asymmetric saddle coil 410 and the large wing of the second asymmetric saddle coil 412, increases the signal sensitivity of the coil array 200 (shown in FIG. 2), for example, at the middle of the coil array. In addition, the quadrature nature between the two asymmetric saddle coils 410, 412 keeps the correlated noise low. This results in significant SNR improvement for, for example, sine imaging. The asymmetric design of the two wings 414, 416 of each asymmetric saddle coil 410, 412 allows an increase in the overlap area (or region) 418 between them, for example, the exemplary overlap area 418 of the large wings 416 shown in FIG. 4 is about 45% of the large wing 416 area of each of the asymmetric saddle coils 410, 412. The large overlap area 418 is due to the quadrature nature between the two asymmetric saddle coils 410, 412 and, as mentioned, increases the signal while keeping the correlated noise low to achieve significant SNR improvement. A double asymmetric saddle coil pair 406 may be used in a large RF coil array to further increase the SNR of the RF coil array.

Figure 5:
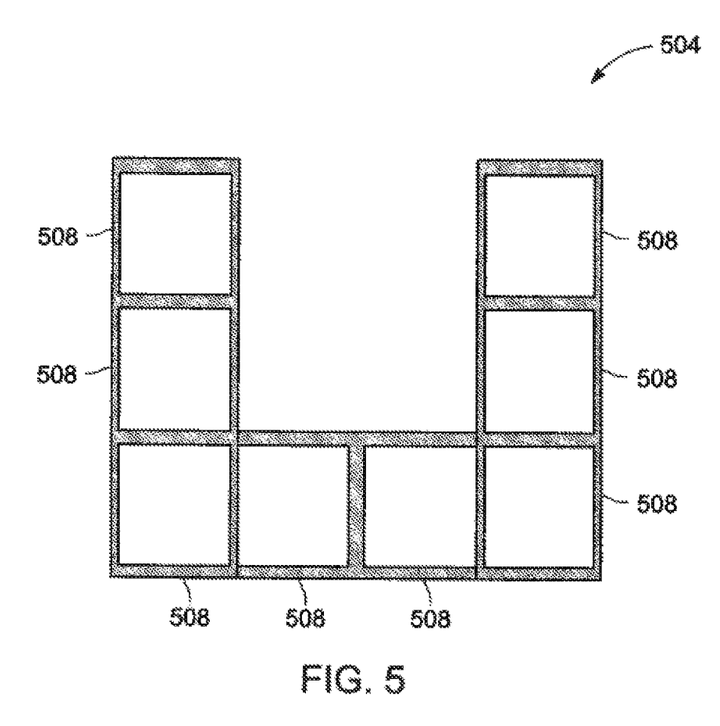
FIG. 5 shows a second coil section of the RF coil array of FIG. 2 in accordance with an embodiment.

Returning to FIG. 2, the second coil array section 204 consists of eight (8) loop coils 208 arranged around a portion of the perimeter of the first coil array section 202. FIG. 5 shows a second coil array section of the RF coil array in accordance with an embodiment. The loop coils 508 of the second coil array section 504 are arranged in a U-shape. Loop coils 508 are formed together on a former such as, for example, a rigid former or a foam former as known in the art. In a preferred embodiment, the second coil array section 204, 504 is configured for thoracic imaging and, in particular, the regions and structures of the thoracic cavity other than the heart. The loop coils 508 provide the depth of penetration and sensitivity needed to image deeper structures (for example, deep vasculature) and structures outside of the central thoracic region.

Referring again to FIG. 2, RF coil array 200 may be used for an anterior coil array and/or for a posterior coil array. In an embodiment, a 32 channel phased array coil system may be provided by using an anterior coil array (configured as RF coil array 200) and a posterior coil array (configured as RF coil array 200) together. In such a system, 16 channels (eight channels in the anterior array and eight channels in the posterior array) may be dedicated to cardiac imaging and 16 channels (eight channels in the anterior array and eight channels in the posterior array) may be dedicated to thoracic imaging. RF coil 200 may also be used for parallel imaging.

As mentioned above, in RF coil array 200 the first coil array section 202 can be used for cardiac imaging and the second coil array section can be used for thoracic imaging. The combination of the two sections 202, 204 provides a large field-of-view and allows the sensitive volume to be tailored to that of the thorax without issues of noise and sensitivity to artifacts. The design of RF coil array 200 allows the generation of high resolution and high SNR images. In addition, as mentioned, in an embodiment RF coil array 200 may be configured so that the second coil array section 204 can be removed from the first coil array section 202. Accordingly, if cardiac-only imaging is desired, the peripheral loop coils 208 can be removed leaving just the first coil array section 202 for the cardiac-only imaging. This can reduce the weight of the RF coil system and be more comfortable for a patient.

Figure 6:
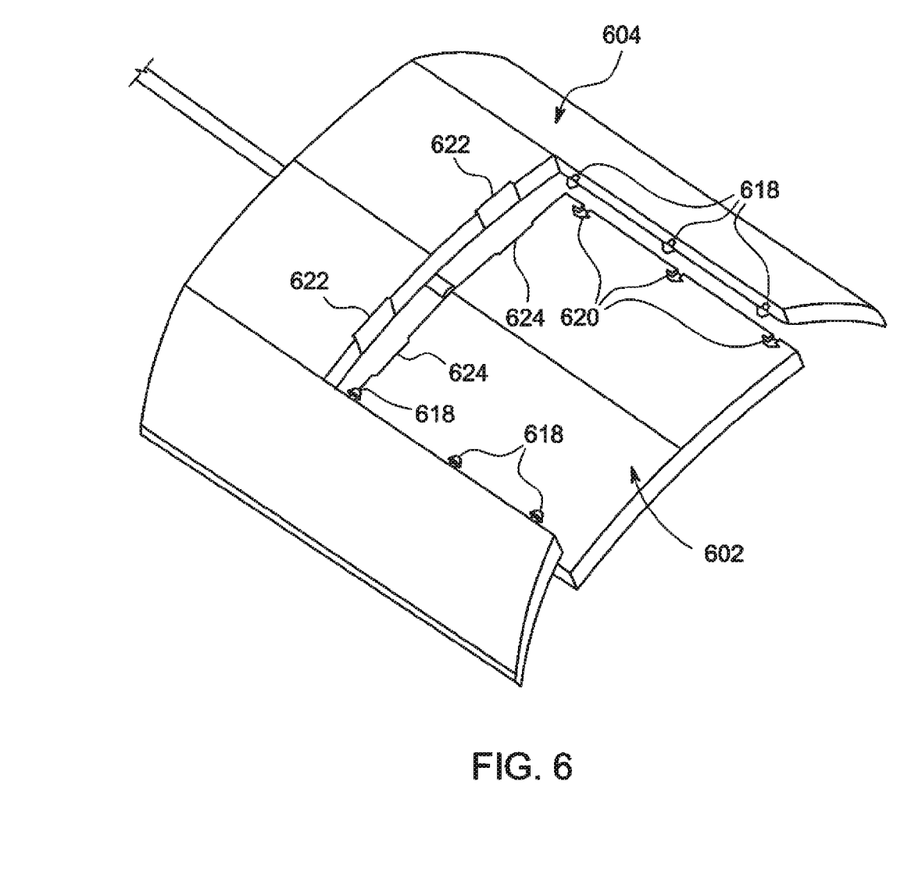
FIG. 6 is a top view of an anterior coil showing exemplary mechanical and electrical connections for the sections of the RF coil array of FIG. 2 in accordance with an embodiment.
Figure 7:
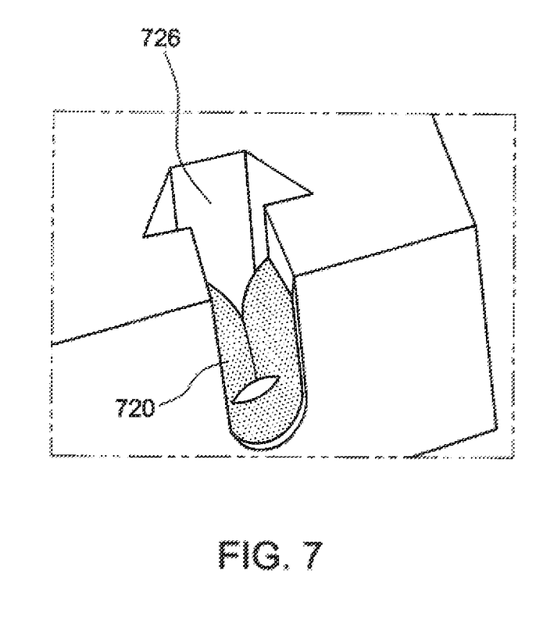
FIGS. 7 and 8 show an exemplary latch and pin mechanical locking system in accordance with an embodiment.
Figure 8:
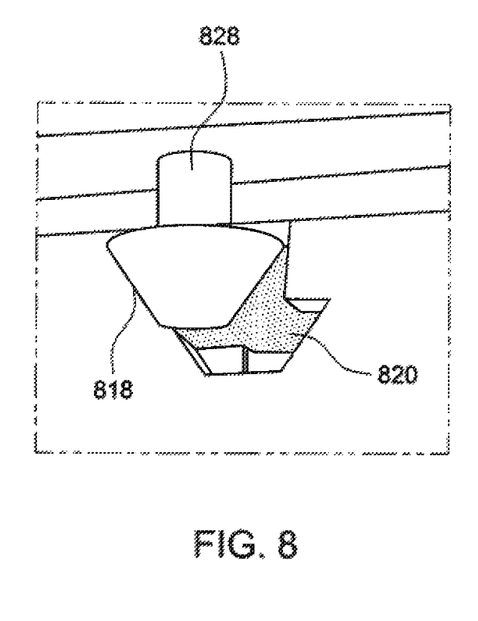
Figure 9:
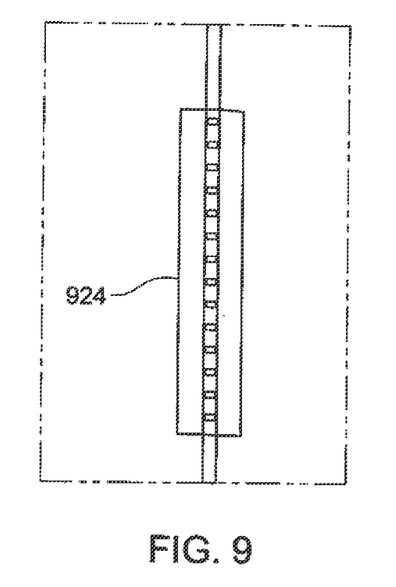
FIGS. 9 and 10 show an exemplary electrical connector pair in accordance with an embodiment.
Figure 10:
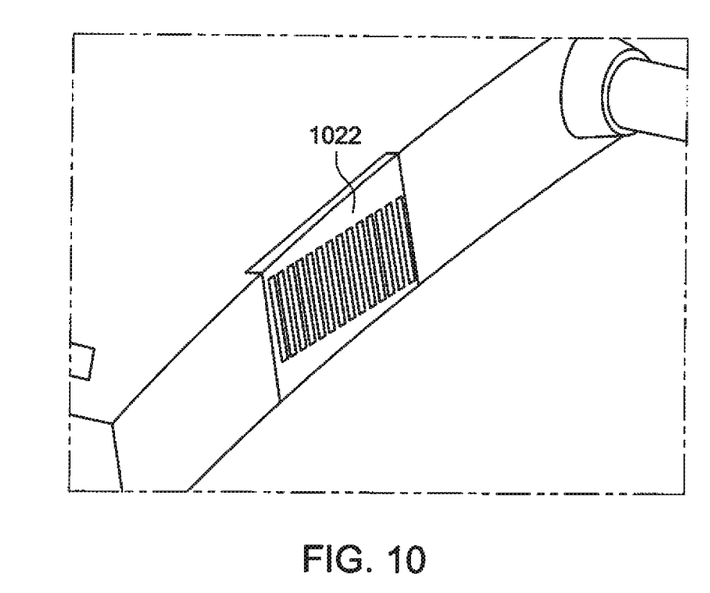

Various known mechanical connections such as clips, latch/pin pairs, etc. may be used to attach (and detach) the first coil array section 202 and the second coil array section 204 and various known electrical connectors may be used to provide electrical interconnections between the first coil array section 202 and the second coil array section 204. FIG. 6 is a top view of an anterior coil showing exemplary mechanical and electrical connections for the sections of the RF coil array of FIG. 2 in accordance with an embodiment. In FIG. 6, the first coil array section 602 and the second coil array section 604 are shown in a disconnected condition. A set of latch and pin pairs may be used to attach and permit mechanical locking of the first coil array section 602 and the second coil array section 604. The second coil array section 604 includes six pins 618 and the first coil array section 602 includes six latches (only three shown) 620. The pins 618 of the second coil array section 604 may be pushed down into the latches 620 and lock into place. A set of face contacting, spring loaded pin or bar connectors 622, 624 may be used to provide electrical interconnections between the first coil array section 602 and the second coil array section 604. FIGS. 7 and 8 show an exemplary latch and pin mechanical locking system in accordance with an embodiment. A slot 726 in the first coil array section 602 (shown in FIG. 6) is used to permit the locking pin 818 to move downward into the latch 720, 820 and become locked into place. A cam surface on the top of the latch 720 allows the pin 818 to force the latch pair 720, 820 apart (e.g., by cam action) as the pin 818 is pushed down to allow entry of the pin 818 into the latch pair 720, 820. The latch pair 720 may be spring-loaded (e.g., using composite (e.g., G10) springs) and grasp a round shaft 828 of the pin once the pin is set in place. The latch pair 720 may be released by pulling them apart using a release mechanism (not shown) such as, for example, an internal bell-crank mechanism and release handles. The pins 818 and latches 720, 820 may be made from an engineering plastic such as, a polyimide, a polyether-ether-ketone, a polycarbonate, or fiber reinforced thermoset resin. FIGS. 9 and 10 show an exemplary electrical connector pair in accordance with an embodiment. One coil array section, for example, first coil array section 602 (shown in FIG. 6) includes a first connector 924 of the electrical connector pair and the other coil array section, for example, second coil array section 604 (shown in FIG. 6) includes a second connector 1022 of the electrical connector pair. The connectors may be, for example made of spring loaded bars or pins constructed from gold or silver-plated copper alloy (such as phosphor bronze, Elkonite CuW, UNS 17400 BECU, etc.). Preferably, the pins are designed to slide past one another to permit easy connection and disconnection and to be tolerant of considerable misalignment (angular and translational) while maintaining adequate current carrying capacity. The electrical connector 924, 1002 is designed to pass both RF and DC signals. In certain embodiments, a balun (not shown) may also be used to facilitate the passage of RF signals.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

We claim:

1. A radio frequency (RF) coil array comprising:
a first coil section comprising: a first row of a plurality of double asymmetric saddle coil pairs arranged in a left-right direction; and a second row of a plurality of double asymmetric saddle coil pairs arranged in a left-right direction; wherein the first row and the second row are arranged along a superior-inferior direction; and
a second coil section mechanically coupled to the first coil section in a non-overlapping manner, the second coil section comprising a plurality of loop coils arranged around at least a portion of a perimeter of the first coil section.

2. An RF coil array according to claim 1, wherein the second coil section is removably coupled to the first coil section so that the second coil section can be detached from the first coil section.

3. An RF coil array according to claim 1, wherein the first row of the first coil section comprises two double asymmetric saddle coil pairs arranged in a left-right direction.

4. An RF coil array according to claim 1, wherein the second row of the first coil section comprises two double asymmetric saddle coil pairs arranged in a left-right direction.

5. An RF coil array according to claim 1, wherein the plurality of loop coils are arranged in a U-shape around the perimeter of the first coil section.

6. An RF coil array according to claim 1, wherein the second coil section comprises eight loop coils.

7. An RF coil array according to claim 6, wherein the eight loop coils are arranged in a U-shape around the perimeter of the first coil section.

8. An RF coil array according to claim 1, wherein the first coil section is configured for cardiac imaging.

9. An RF coil array according to claim 1, the RF coil array configured for thoracic imaging.

10. An RF coil array according to claim 1, the RF coil array configured for cardiac and thoracic imaging.

11. An RF coil array according to claim 1, wherein the RF coil array is an anterior RF coil array.

12. An RF coil array according to claim 1, wherein the RF coil array is a posterior RF coil array.

13. An RF coil array according to claim 1, wherein the second coil section is configured for thoracic imaging.

14. An RF coil array system comprising:
an anterior RF coil array comprising a first anterior coil section having a plurality of double asymmetric saddle coil pairs and a second anterior coil section mechanically coupled to the first anterior coil section and having a plurality of loop coils arranged around at least a portion of a perimeter of the first anterior coil section; and
a posterior RF coil array comprising a first posterior coil section having a plurality of double asymmetric saddle coil pairs and a second posterior coil section mechanically coupled to the first posterior coil section and having a plurality of loop coils arranged around at least a portion of a perimeter of the first posterior coil section.

15. An RF coil array system according to claim 14, wherein the second anterior coil section is removably coupled to the first anterior coil section so that the second anterior coil section can be detached from the first anterior coil section.

16. An RF coil array system according to claim 14, wherein the second posterior coil section is removably coupled to the first posterior coil section so that the second posterior coil section can be detached from the first posterior coil section.

17. An RF coil array system according to claim 14, wherein the first anterior coil section comprises a first row of a plurality of double asymmetric saddle coil pairs arranged in a left-right direction and a second row of double asymmetric saddle coil pairs arranged in a left-right direction, wherein the first row and the second row are arranged along a superior-inferior direction.

18. An RF coil array system according to claim 14, wherein the first posterior coil section comprises a first row of a plurality of double asymmetric saddle coil pairs arranged in a left-right direction and a second row of double asymmetric saddle coil pairs arranged in a left-right direction, wherein the first row and the second row are arranged along a superior-inferior direction.

19. An RF coil array system according to claim 14, wherein the plurality of loop coils of the second anterior coil section are arranged in a U-shape.

20. An RF coil array system according to claim 14, wherein the plurality of loop coils of the second posterior coil section are arranged in a U-shape.

21. An RF coil array according to claim 1, wherein the first coil section has a first edge that includes a pin and the second coil section has a second edge that includes a latch that is configured to lock with the pin.

22. An RF coil array according to claim 1, wherein the first coil section has a first edge that includes a pin and the second coil section has a second edge that includes a latch to mechanically couple the first coil section to the second coil section in the non-overlapping manner.

23. An RF coil array according to claim 1, wherein the first coil section is detachable from the second coil section.

\* \* \* \* \*